(12) United States Patent
Reber et al.

(10) Patent No.: US 10,916,953 B2
(45) Date of Patent: Feb. 9, 2021

(54) HOUSING FOR AN ELECTRICITY CHARGING STATION AND METHOD FOR PRODUCING SAME

(71) Applicant: Dr. Ing. h.c. F. Porsche Aktiengesellschaft, Stuttgart (DE)

(72) Inventors: Volker Reber, Michelbach an der Bilz (DE); Bekim Basha, Böblingen (DE); David Köhler, Bietigheim-Bissingen (DE); Karsten Hähre, Dudenhofen (DE); Camila Zies, Stuttgart (DE); Christian Metzger, Tamm (DE)

(73) Assignee: Dr. Ing. h.c. F. Porsche Aktiengesellschaft (DE)

( * ) Notice: Subject to any disclaimer, the term of this patent is extended or adjusted under 35 U.S.C. 154(b) by 181 days.

(21) Appl. No.: 16/026,167

(22) Filed: Jul. 3, 2018

(65) Prior Publication Data
US 2019/0020206 A1 Jan. 17, 2019

(30) Foreign Application Priority Data
Jul. 12, 2017 (DE) .................. 10 2017 115 702

(51) Int. Cl.
| | |
|---|---|
| H02J 7/00 | (2006.01) |
| H05K 7/20 | (2006.01) |
| H05K 5/03 | (2006.01) |
| H05K 5/02 | (2006.01) |
| H05K 7/18 | (2006.01) |
| B60L 53/31 | (2019.01) |

(52) U.S. Cl.
CPC ............ *H02J 7/0042* (2013.01); *B60L 53/31* (2019.02); *H05K 5/0226* (2013.01); *H05K 5/03* (2013.01); *H05K 7/18* (2013.01); *H05K 7/20554* (2013.01); *H05K 7/20909* (2013.01)

(58) Field of Classification Search
CPC .............. H02J 7/0042; H05K 7/20554; H05K 7/20909; H05K 5/0226; H05K 5/0004; H05K 7/18; H05K 5/03; B60S 5/00; H02B 1/30; H02B 1/56; B60L 53/31
USPC .......................................................... 320/107
See application file for complete search history.

(56) References Cited

U.S. PATENT DOCUMENTS

| | | | | |
|---|---|---|---|---|
| 4,772,999 A | * | 9/1988 | Fiorina ................... | H02J 9/062 361/709 |
| 4,859,008 A | * | 8/1989 | Eyre .................. | A47B 47/0008 312/257.1 |
| 4,994,940 A | * | 2/1991 | Thouvenin ............... | H05K 7/18 361/831 |

(Continued)

FOREIGN PATENT DOCUMENTS

| | | | |
|---|---|---|---|
| CN | 106451096 A | * | 2/2017 |
| DE | 102014112799 A1 | | 3/2016 |

(Continued)

*Primary Examiner* — John T Trischler
(74) *Attorney, Agent, or Firm* — RatnerPrestia

(57) ABSTRACT

A housing for an electricity charging station includes a base frame having a mounting rack, a cover connected to the base frame, two doors hinged on the base frame, a base connected to the base frame, two faceplates inserted into the base and two cable panels embedded in the base. A corresponding electricity charging station and a corresponding method for producing or assembling such a housing.

11 Claims, 15 Drawing Sheets

(56) References Cited

U.S. PATENT DOCUMENTS

| | | | | |
|---|---|---|---|---|
| 5,001,602 | A * | 3/1991 | Suffi | H04Q 1/028 361/724 |
| 5,373,912 | A * | 12/1994 | Haiki | B60K 23/0808 180/249 |
| 5,847,537 | A * | 12/1998 | Parmley, Sr. | B60L 8/003 320/109 |
| 5,939,858 | A * | 8/1999 | Dodd | H02J 7/0042 180/68.5 |
| 5,975,371 | A * | 11/1999 | Webb | B60S 5/02 137/376 |
| 6,218,796 | B1 * | 4/2001 | Kozlowski | G06F 1/1632 318/139 |
| 6,541,705 | B1 * | 4/2003 | McGrath | H05K 7/186 174/101 |
| 6,651,446 | B1 * | 11/2003 | Woods | F25B 21/02 136/242 |
| 6,877,551 | B2 * | 4/2005 | Stoller | H02B 1/565 165/122 |
| 6,877,827 | B2 * | 4/2005 | Holighaus | H02B 1/30 312/213 |
| 7,230,836 | B2 * | 6/2007 | Miller | H04Q 1/06 174/51 |
| 7,233,731 | B2 * | 6/2007 | Solheid | G02B 6/3893 385/135 |
| 7,269,030 | B2 * | 9/2007 | Miller | H04Q 1/06 174/51 |
| 7,293,666 | B2 * | 11/2007 | Mattlin | G06F 1/181 211/189 |
| 7,310,234 | B2 * | 12/2007 | Miller | H04Q 1/06 361/752 |
| 7,369,741 | B2 * | 5/2008 | Reagan | G02B 6/3897 385/139 |
| 7,400,816 | B2 * | 7/2008 | Reagan | G02B 6/4471 385/139 |
| 7,457,503 | B2 * | 11/2008 | Solheid | G02B 6/445 385/135 |
| 7,471,869 | B2 * | 12/2008 | Reagan | H04B 10/25 385/139 |
| 7,525,799 | B2 * | 4/2009 | Lai | H05K 7/20572 361/695 |
| 7,532,482 | B2 * | 5/2009 | Miller | H04Q 1/06 361/752 |
| 7,536,868 | B1 * | 5/2009 | Ward | A47F 3/0404 62/237 |
| 7,809,232 | B2 * | 10/2010 | Reagan | G02B 6/445 385/134 |
| 7,809,235 | B2 * | 10/2010 | Reagan | H04Q 1/14 385/135 |
| 7,844,159 | B2 * | 11/2010 | Solheid | G02B 6/4442 385/135 |
| 7,844,161 | B2 * | 11/2010 | Reagan | G02B 6/3849 385/135 |
| 7,873,255 | B2 * | 1/2011 | Reagan | G02B 6/3897 385/139 |
| 7,995,894 | B2 * | 8/2011 | Solheid | G02B 6/3893 385/135 |
| 8,033,406 | B2 * | 10/2011 | Mattlin | G06F 1/181 211/192 |
| 8,100,271 | B2 * | 1/2012 | Conrardy | H01M 2/1077 211/49.1 |
| 8,210,490 | B2 * | 7/2012 | Mattlin | G06F 1/181 248/558 |
| 8,285,103 | B2 * | 10/2012 | Reagan | G02B 6/4452 385/134 |
| 8,320,110 | B2 * | 11/2012 | Chen | G06F 1/1632 235/462.46 |
| 8,353,492 | B2 * | 1/2013 | Mattlin | G06F 1/181 248/221.11 |
| 8,374,476 | B2 * | 2/2013 | Reagan | G02B 6/445 385/135 |
| 8,401,357 | B2 * | 3/2013 | Solheid | G02B 6/3893 385/135 |
| 8,432,692 | B2 * | 4/2013 | Peng | H05K 7/20781 361/679.47 |
| 8,463,449 | B2 * | 6/2013 | Sanders | G05B 15/02 320/101 |
| 8,519,859 | B2 * | 8/2013 | Forristal | H05K 7/186 211/26 |
| 8,528,872 | B2 * | 9/2013 | Mattlin | G06F 1/181 248/221.11 |
| 8,621,877 | B2 * | 1/2014 | Tuszkiewicz | A47F 3/0426 62/259.1 |
| 8,625,288 | B1 * | 1/2014 | Liu | 361/724 |
| 8,721,010 | B2 * | 5/2014 | Conrardy | H01M 2/1077 312/223.1 |
| 8,811,791 | B2 * | 8/2014 | Solheid | G02B 6/4471 385/135 |
| 8,982,554 | B2 * | 3/2015 | Stewart | H05K 7/20145 312/223.2 |
| 9,112,205 | B2 * | 8/2015 | Conrardy | H01M 2/1077 |
| 9,130,385 | B2 * | 9/2015 | Chen | H02J 7/0044 |
| 9,146,372 | B2 * | 9/2015 | Reagan | H04Q 1/114 |
| 9,146,373 | B2 * | 9/2015 | Reagan | H04Q 1/14 |
| 9,250,408 | B2 * | 2/2016 | Solheid | G02B 6/4471 |
| 9,301,408 | B2 * | 3/2016 | Conrardy | H01M 2/1077 |
| 9,304,276 | B2 * | 4/2016 | Solheid | G02B 6/4471 |
| 9,312,525 | B2 * | 4/2016 | Conrardy | H01M 2/1077 |
| 9,335,505 | B2 * | 5/2016 | Reagan | H04B 10/25 |
| 9,541,724 | B2 * | 1/2017 | Solheid | G02B 6/4442 |
| 9,570,940 | B2 * | 2/2017 | Hysell | H02J 9/061 |
| 9,600,045 | B2 * | 3/2017 | Sanders | G05B 15/02 |
| 9,609,769 | B2 * | 3/2017 | Kingston | H01H 9/342 |
| 9,739,970 | B2 * | 8/2017 | Reagan | H04Q 1/021 |
| 9,755,200 | B2 * | 9/2017 | Conrardy | H01M 2/1077 |
| 9,819,158 | B2 * | 11/2017 | Tremaine | H02B 1/44 |
| 9,837,804 | B2 * | 12/2017 | Tremaine | H02G 3/123 |
| 10,151,896 | B2 * | 12/2018 | Solheid | G02B 6/3893 |
| 10,312,484 | B2 * | 6/2019 | Conrardy | H01M 2/1077 |
| 10,371,915 | B2 * | 8/2019 | Solheid | G02B 6/3893 |
| 10,393,980 | B2 * | 8/2019 | Reagan | G02B 6/3897 |
| 10,412,853 | B2 * | 9/2019 | Dombrowski | H02J 5/00 |
| 10,436,998 | B2 * | 10/2019 | Solheid | G02B 6/46 |
| 10,527,401 | B2 * | 1/2020 | Gotz | B60L 53/30 |
| 10,527,809 | B2 * | 1/2020 | Solheid | G02B 6/3897 |
| 2001/0029710 | A1 * | 10/2001 | Notohardjono | H05K 7/1495 52/167.1 |
| 2001/0036399 | A1 * | 11/2001 | Notohardjono | H02B 1/54 414/800 |
| 2004/0007348 | A1 * | 1/2004 | Stoller | H02B 1/565 165/47 |
| 2004/0007951 | A1 * | 1/2004 | Holighaus | H02B 1/30 312/265.4 |
| 2004/0080244 | A1 * | 4/2004 | Lowther, Jr. | A47B 45/00 312/205 |
| 2004/0240161 | A1 * | 12/2004 | Miller | H04Q 1/06 361/679.01 |
| 2005/0002633 | A1 * | 1/2005 | Solheid | G02B 6/4457 385/135 |
| 2005/0128722 | A1 * | 6/2005 | Miller | H04Q 1/06 361/797 |
| 2005/0133238 | A1 * | 6/2005 | Miller | H04Q 1/06 174/559 |
| 2006/0008231 | A1 * | 1/2006 | Reagan | H04Q 1/114 385/135 |
| 2006/0102575 | A1 * | 5/2006 | Mattlin | G06F 1/181 211/189 |
| 2006/0172685 | A1 * | 8/2006 | O'Brien | H05K 7/207 454/184 |
| 2006/0265853 | A1 * | 11/2006 | Povolny | H02B 1/30 29/462 |
| 2006/0268533 | A1 * | 11/2006 | Miller | H04Q 1/06 361/797 |
| 2007/0178369 | A1 * | 8/2007 | Conrardy | H01M 2/1077 429/100 |
| 2007/0210686 | A1 * | 9/2007 | Adducci | H04Q 1/026 312/265.2 |
| 2007/0278915 | A1 * | 12/2007 | Conrardy | H01M 2/1077 312/257.1 |

(56) References Cited

U.S. PATENT DOCUMENTS

| | | | | |
|---|---|---|---|---|
| 2008/0008436 A1* | 1/2008 | Reagan | G02B 6/4452 | 385/135 |
| 2008/0008437 A1* | 1/2008 | Reagan | G02B 6/4452 | 385/135 |
| 2008/0013910 A1* | 1/2008 | Reagan | H04Q 1/114 | 385/135 |
| 2008/0062654 A1* | 3/2008 | Mattlin | G06F 1/181 | 361/727 |
| 2008/0075411 A1* | 3/2008 | Solheid | G02B 6/4452 | 385/135 |
| 2008/0151496 A1* | 6/2008 | Lai | H05K 7/20572 | 361/695 |
| 2008/0290836 A1* | 11/2008 | Tsai | H02J 7/0042 | 320/114 |
| 2009/0074372 A1* | 3/2009 | Solheid | G02B 6/4457 | 385/135 |
| 2009/0267564 A1* | 10/2009 | Gerber | H02J 7/0027 | 320/114 |
| 2009/0285540 A1* | 11/2009 | Reagan | G02B 6/4471 | 385/135 |
| 2009/0290843 A1* | 11/2009 | Reagan | G02B 6/4471 | 385/135 |
| 2009/0297111 A1* | 12/2009 | Reagan | H04Q 1/14 | 385/135 |
| 2010/0124392 A1* | 5/2010 | Reagan | G02B 6/3849 | 385/24 |
| 2011/0019966 A1* | 1/2011 | Reagan | G02B 6/4471 | 385/135 |
| 2011/0033164 A1* | 2/2011 | Solheid | G02B 6/4446 | 385/135 |
| 2011/0246014 A1 | 10/2011 | Sauper | | |
| 2011/0262098 A1* | 10/2011 | Solheid | G02B 6/4452 | 385/135 |
| 2011/0291565 A1* | 12/2011 | Hysell | H02J 9/061 | 315/86 |
| 2011/0291852 A1* | 12/2011 | Forristal | H05K 7/186 | 340/686.1 |
| 2011/0297351 A1* | 12/2011 | Vosper | H05K 7/20818 | 165/67 |
| 2012/0025683 A1* | 2/2012 | Mattlin | G06F 1/181 | 312/326 |
| 2012/0050984 A1* | 3/2012 | Peng | H05K 7/20781 | 361/679.47 |
| 2012/0087074 A1* | 4/2012 | Chen | G06F 1/1632 | 361/679.02 |
| 2012/0112611 A1* | 5/2012 | Chen | H05K 7/1489 | 312/223.2 |
| 2012/0113570 A1* | 5/2012 | Yang | H05K 7/1495 | 361/679.01 |
| 2012/0117785 A1* | 5/2012 | Conrardy | H01M 2/1077 | 29/525.02 |
| 2012/0248954 A1* | 10/2012 | Mattlin | G06F 1/181 | 312/326 |
| 2013/0008862 A1* | 1/2013 | Conrardy | H01M 2/1077 | 211/26 |
| 2013/0069588 A1* | 3/2013 | Oda | B60L 53/31 | 320/109 |
| 2013/0140972 A1* | 6/2013 | Mattlin | G06F 1/181 | 312/326 |
| 2013/0162055 A1* | 6/2013 | Reber | H02J 7/0042 | 307/150 |
| 2013/0175993 A1* | 7/2013 | Chen | H02J 7/0044 | 320/114 |
| 2013/0251325 A1* | 9/2013 | Solheid | G02B 6/3893 | 385/135 |
| 2014/0050451 A1* | 2/2014 | Reagan | G02B 6/445 | 385/135 |
| 2014/0177164 A1* | 6/2014 | Stewart | H05K 7/20145 | 361/679.46 |
| 2014/0229398 A1* | 8/2014 | Conrardy | H01M 2/1077 | 705/330 |
| 2014/0354126 A1* | 12/2014 | DeLorean | F24F 13/20 | 312/236 |
| 2015/0030301 A1* | 1/2015 | Solheid | G02B 6/4442 | 385/135 |
| 2015/0093091 A1* | 4/2015 | Reagan | H04Q 1/14 | 385/135 |
| 2015/0162580 A1* | 6/2015 | Conrardy | H01M 2/1077 | 29/525.02 |
| 2015/0216298 A1* | 8/2015 | DeLorean | F24F 13/20 | 312/236 |
| 2015/0338592 A1* | 11/2015 | Solheid | G02B 6/4452 | 385/135 |
| 2015/0338600 A1* | 11/2015 | Reagan | H04Q 1/14 | 385/135 |
| 2016/0160530 A1* | 6/2016 | Shen | E05B 47/0012 | 292/138 |
| 2016/0190528 A1* | 6/2016 | Conrardy | H01M 2/1077 | 312/265.6 |
| 2016/0209613 A1* | 7/2016 | Solheid | G02B 6/3897 | |
| 2016/0211687 A1* | 7/2016 | Wang | H02J 7/0042 | |
| 2016/0216467 A1* | 7/2016 | Reagan | H04Q 1/114 | |
| 2016/0241002 A1* | 8/2016 | Tremaine | H02B 1/44 | |
| 2016/0241007 A1* | 8/2016 | Tremaine | H02G 3/123 | |
| 2017/0027079 A1* | 1/2017 | Dombrowski | H02J 5/00 | |
| 2017/0146758 A1* | 5/2017 | Solheid | G02B 6/4442 | |
| 2018/0011271 A1* | 1/2018 | Reagan | G02B 6/445 | |
| 2018/0077822 A1* | 3/2018 | Sloan | H05K 7/20172 | |
| 2018/0249830 A1* | 9/2018 | Jeon | A47B 67/005 | |
| 2018/0251932 A1* | 9/2018 | Jeon | A47B 81/00 | |
| 2018/0255923 A1* | 9/2018 | Kim | F25D 11/00 | |
| 2018/0258579 A1* | 9/2018 | Kim | A47B 47/042 | |
| 2018/0372972 A1* | 12/2018 | Solheid | G02B 6/4471 | |
| 2018/0372973 A1* | 12/2018 | Solheid | G02B 6/3879 | |
| 2019/0016219 A1* | 1/2019 | Gro | H01M 10/6568 | |
| 2019/0016220 A1* | 1/2019 | Kohler | H02G 11/00 | |
| 2019/0016222 A1* | 1/2019 | Reber | B60L 53/18 | |
| 2019/0016224 A1* | 1/2019 | Hahre | B60L 53/14 | |
| 2019/0016225 A1* | 1/2019 | Zies | H02J 7/02 | |
| 2019/0017801 A1* | 1/2019 | Gotz | B60L 53/31 | |
| 2019/0020002 A1* | 1/2019 | Metzger | H01M 10/613 | |
| 2019/0020190 A1* | 1/2019 | Metzger | H02B 1/56 | |
| 2019/0064460 A1* | 2/2019 | Solheid | G02B 6/4478 | |
| 2019/0064461 A1* | 2/2019 | Solheid | G02B 6/4457 | |
| 2019/0135362 A1* | 5/2019 | Fournier | H02J 7/0045 | |
| 2020/0026014 A1* | 1/2020 | Reagan | H04Q 1/114 | |

FOREIGN PATENT DOCUMENTS

| | | | | |
|---|---|---|---|---|
| EP | 1850445 A2 | 10/2007 | | |
| EP | 1976083 A1 * | 10/2008 | | H02B 1/303 |
| EP | 2377208 A2 | 10/2011 | | |
| GB | 2471279 A | 12/2010 | | |
| JP | 2000004512 A | 1/2000 | | |
| JP | 2002319777 A | 10/2002 | | |
| JP | 2006140242 A * | 6/2006 | | |
| JP | 5485850 B2 | 5/2014 | | |
| JP | 2015013614 A | 1/2015 | | |
| WO | WO-2012124296 A1 * | 9/2012 | | H02B 1/38 |

* cited by examiner

HOUSING FOR AN ELECTRICITY CHARGING STATION AND METHOD FOR PRODUCING SAME

CROSS-REFERENCE TO RELATED APPLICATION

This application claims priority to German Patent Application No. DE 10 2017 115 702.6, filed Jul. 12, 2017, which is incorporated by reference herein in its entirety.

FIELD OF THE INVENTION

The present invention relates to a housing for an electricity charging station. The present invention furthermore relates to a corresponding electricity charging station and a corresponding method for producing or assembling such a housing.

BACKGROUND OF THE INVENTION

In electrical engineering, any stationary device or electrical system which serves for supplying energy to mobile, battery-operated units, machines or motor vehicles by way of simple setting or insertion without it being necessary for the energy store—for example the traction battery of an electric automobile—to be removed is referred to as a charging station. Charging stations for electric automobiles are also sometimes referred to as "electricity charging stations" and can comprise a plurality of charging points.

Known here in particular are direct-current fast charging/high-performance charging (HPC) systems in accordance with IEC 61851-23, such as the so-called combined charging system (CCS), which is widespread in Europe. In the case of direct-current charging of the generic type, direct current is fed from the charging column directly into the vehicle and, for this purpose, is provided by way of a powerful rectifier from the power supply system or by way of large buffer accumulators at solar charging stations. Buffer accumulators can also be connected locally in the power supply system of the system operator in order to stabilize the power supply system. In the vehicle, there is generally an OBC (on-board charger) control device. Said on-board charger control device communicates with the charging column and the battery management control device.

The power electronics system is usually located in this case in the charging column. Since the direct-current connections of the charging column are connected directly to corresponding connections of the traction battery, it is possible for high charging currents to be transmitted with little loss, this allowing short charging times but also generating a considerable amount of waste heat.

Known in particular are charging columns having an integrated power electronics system and cooling unit up to 50 kW. These charging columns are less than 600 mm deep, with corresponding cabinet installations higher than 1.8 m. The prior art further comprises air-cooled systems.

DE102014112799A1, which is incorporated by reference herein, discloses a charging station having a power connection, connection means, control apparatus between the power connection and the connection means, a rectangular control module comprising the control apparatus, and at least one rectangular functional module for fulfilling a further function of the charging station.

EP 2377208 A2, which is incorporated by reference herein, relates to a modular electricity charging station system for electric vehicles fundamentally consisting of three parts: a docking station, a master module and a user module, wherein the docking station itself does not contain an electronics system but contains exclusively a terminal section for feeding power and grounding and compartments for accommodating the master module and the user module together with corresponding connectors for the charging current and electronics system. A method for absorbing energy by means of a cell phone is also claimed.

EP1850445B1, which is incorporated by reference herein, proposes a battery charging point having a battery charging device, a fire prevention safety box in which the battery charging device is arranged, a fire alarm for identifying the development of a fire in the safety box, and an isolating switch, which connects the battery charging device to the battery and which is actuated by the monitoring device in such a way that it isolates the battery charging device from the battery in the event of a fire.

JP2015013614A, JP5485850B2, GB2471279A, JP2002319777A, and JP2000004512A, each of which is incorporated by reference herein in its entirety, discuss further housing designs for electricity charging stations and charging park components.

SUMMARY OF THE INVENTION

Described herein is a housing for an electricity charging station, a corresponding electricity charging station and a corresponding production method in accordance with the independent claims.

One advantage of this solution is its suitability for housing a wide variety of components in the external region of electricity charging stations while observing any local building regulations and avoiding the development of noise during the charging process.

A housing according to aspects of the invention in this case provides the components housed therein with protection from the weather to at least IP 54, vandalism, theft and excessive operating temperatures. With a break-in protection class of RC2, for example, the cooling unit, the power electronics system, the cooling unit and the power electronics system together and optional energy stores or isolating transformers are safeguarded in this way.

Finally, by way of its modular housing design that is based on the ever identical base body and that has external dimensions corresponding to the housing, for example each 1.2 m wide and deep at a height of 1.3 m, a corresponding configuration of the invention permits the transport of two housings fitted with components on a truck bed surface next to one another to the installation location. In this case, one front door per housing half provides the technician with optimum installation options, while a pleasing visual appearance and air inlets and outlets that are optimized in terms of noise and power prove to be advantageous for the end user.

Further advantageous configurations of the invention are specified in the dependent patent claims.

BRIEF DESCRIPTION OF THE DRAWING

Exemplary embodiments of the invention are illustrated in the drawings and are described in more detail below.

DETAILED DESCRIPTION OF THE INVENTION

Figure 1:
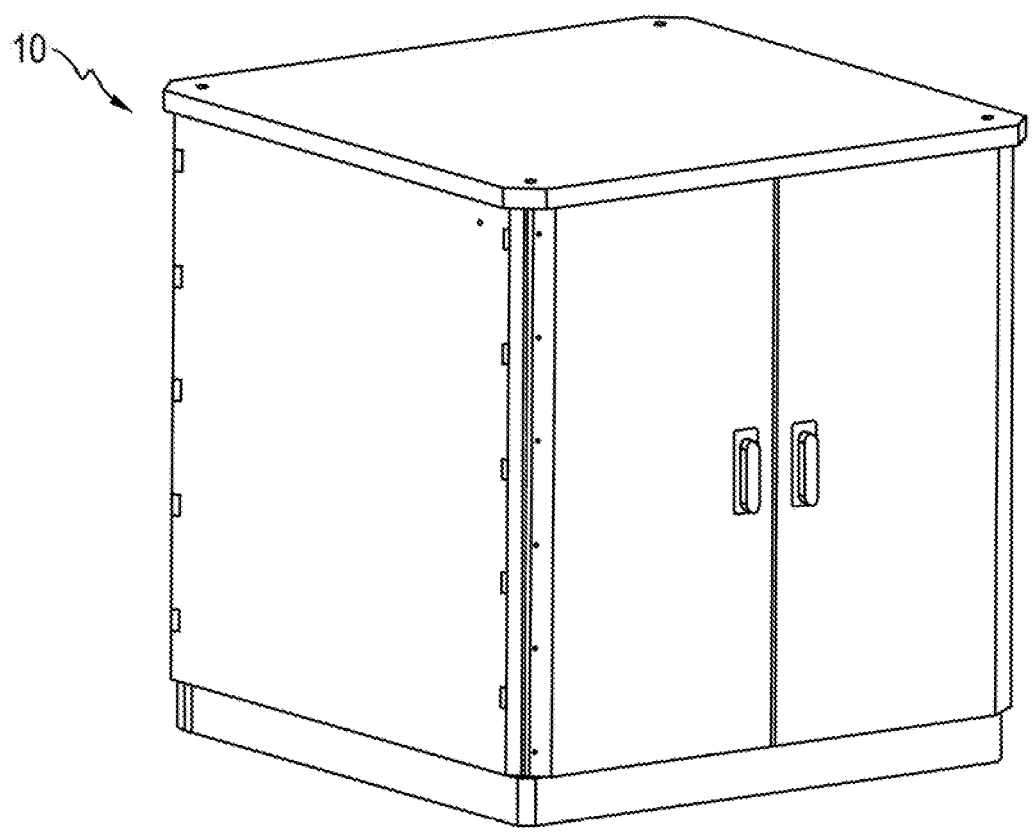
FIG. 1 shows the view of a first housing from the front left.
Figure 2:
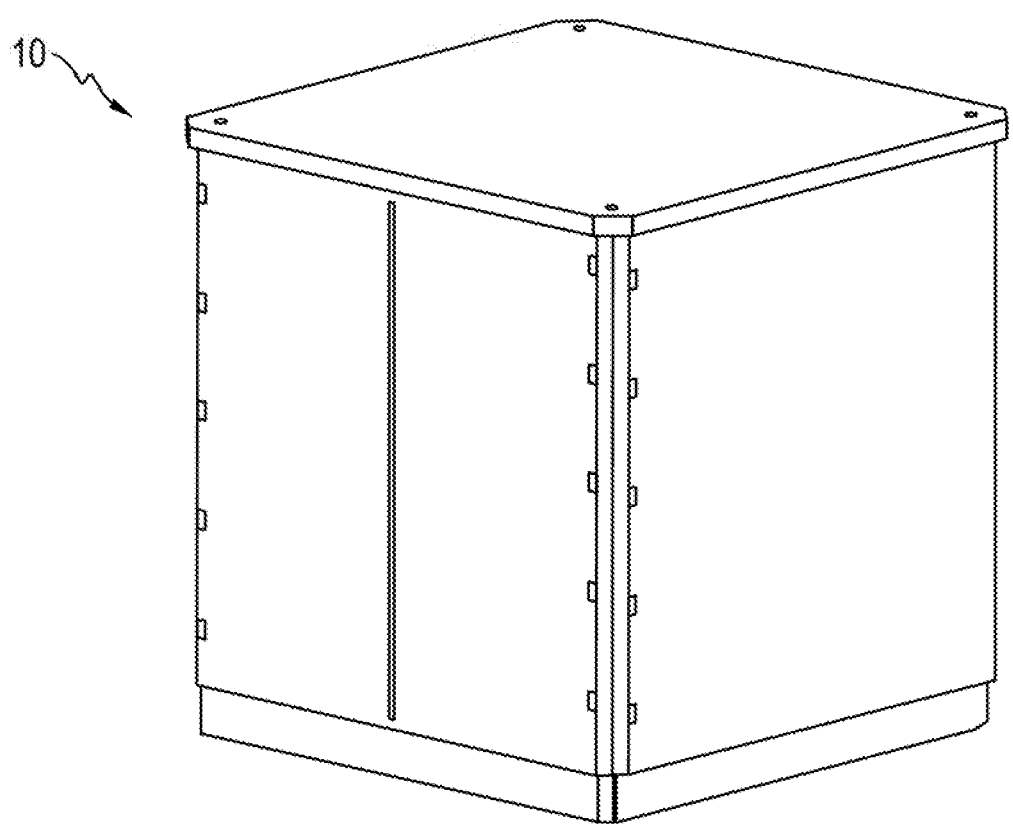
FIG. 2 shows the view of the first housing from the back left.
Figure 3:
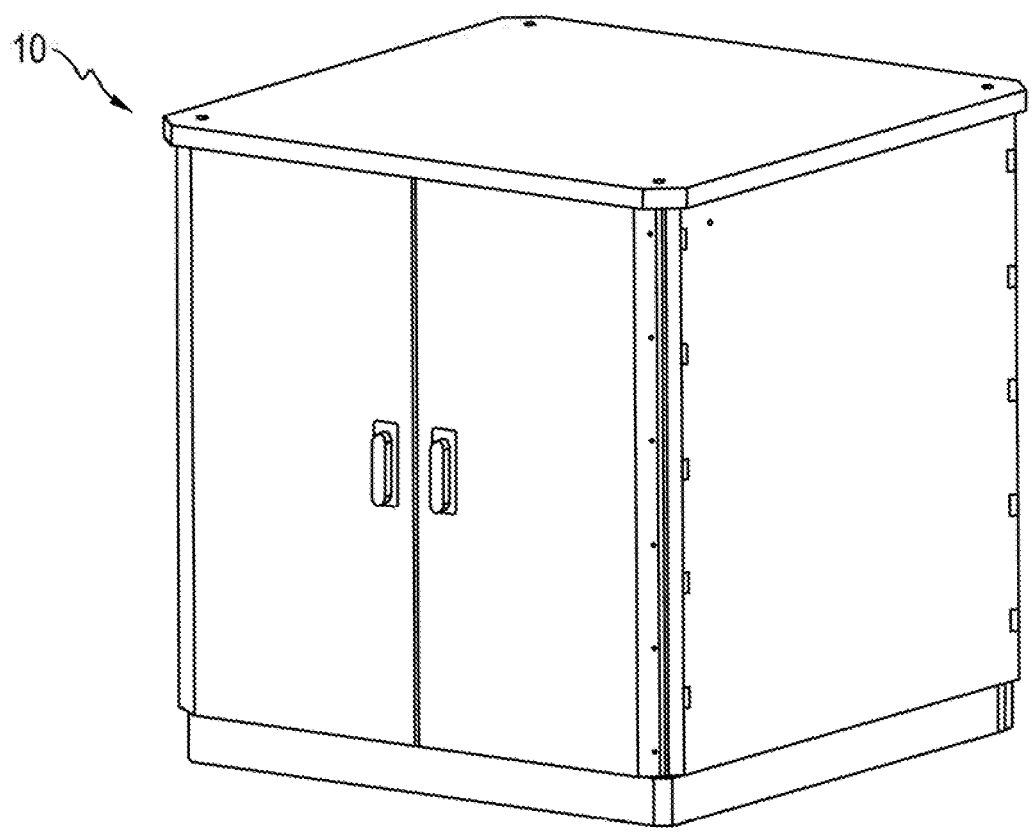
FIG. 3 shows the view of the first housing from the front right.
Figure 4:
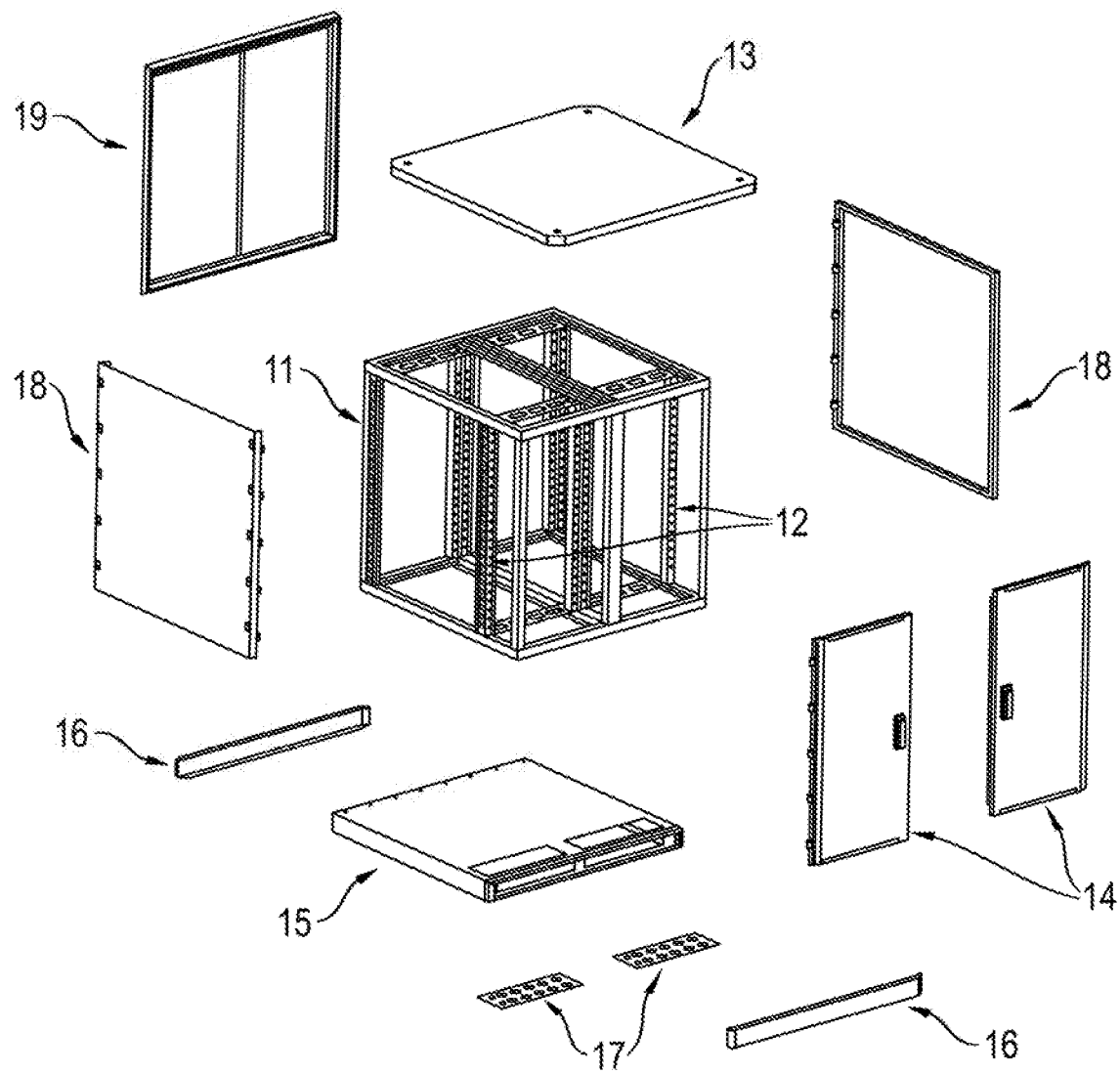
FIG. 4 shows an exploded illustration of the first housing.
Figure 5:
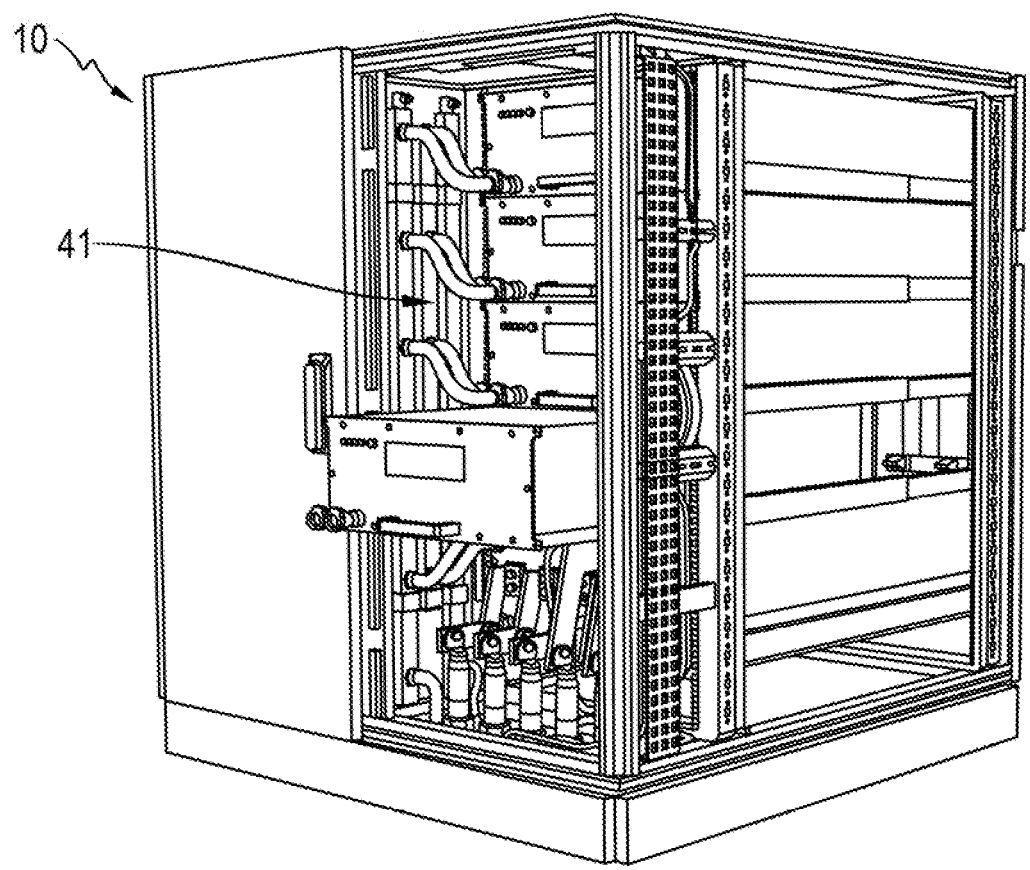
FIG. 5 shows the first housing fitted with a power unit.
Figure 6:
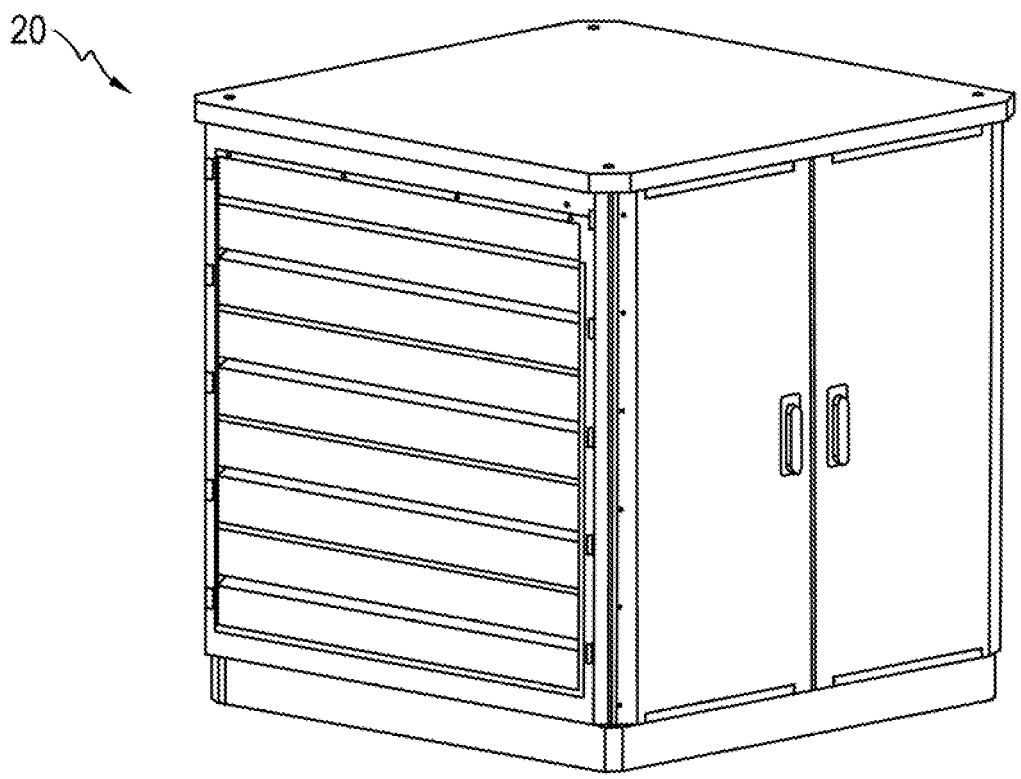
FIG. 6 shows the view of a second housing from the front left.
Figure 7:
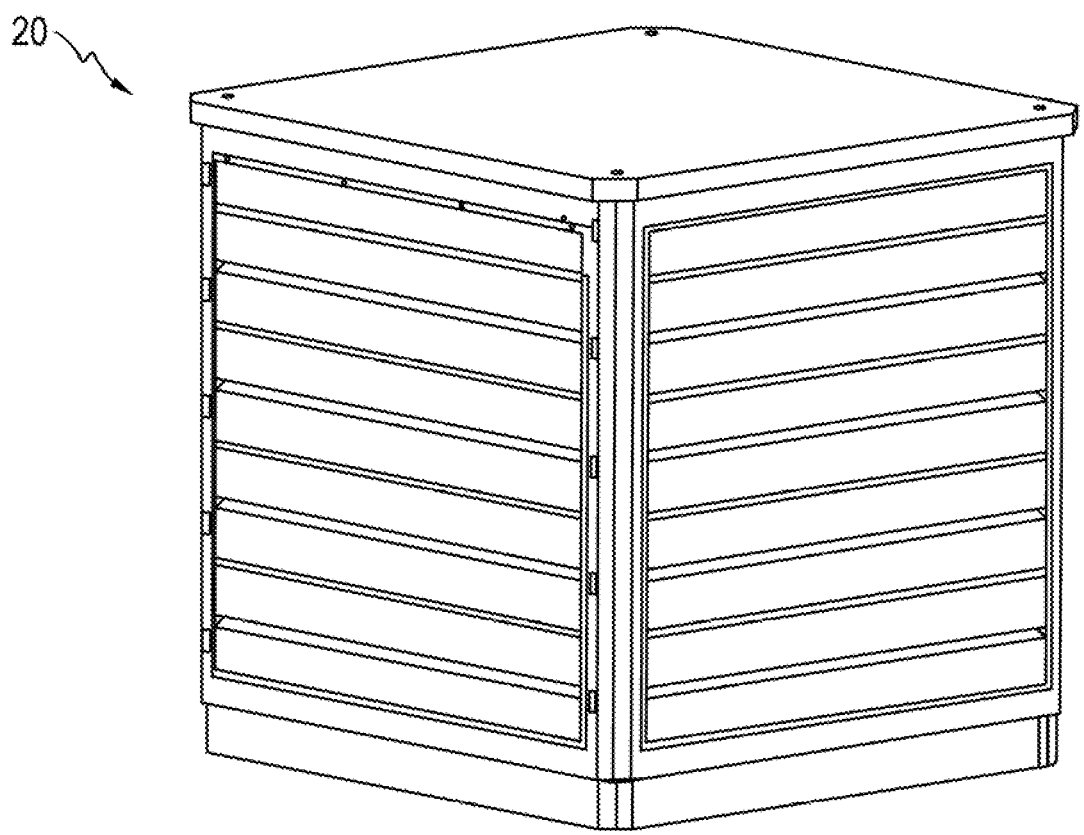
FIG. 7 shows the view of the second housing from the back left.
Figure 8:
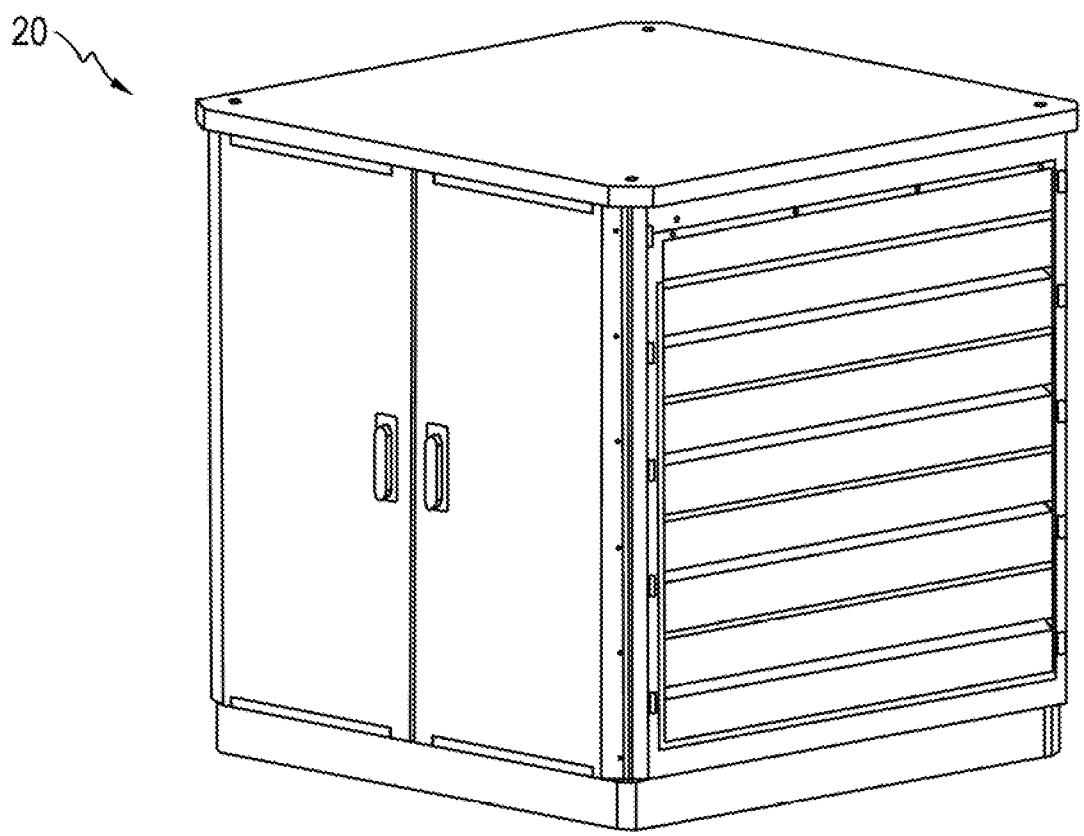
FIG. 8 shows the view of the second housing from the front right.
Figure 9:
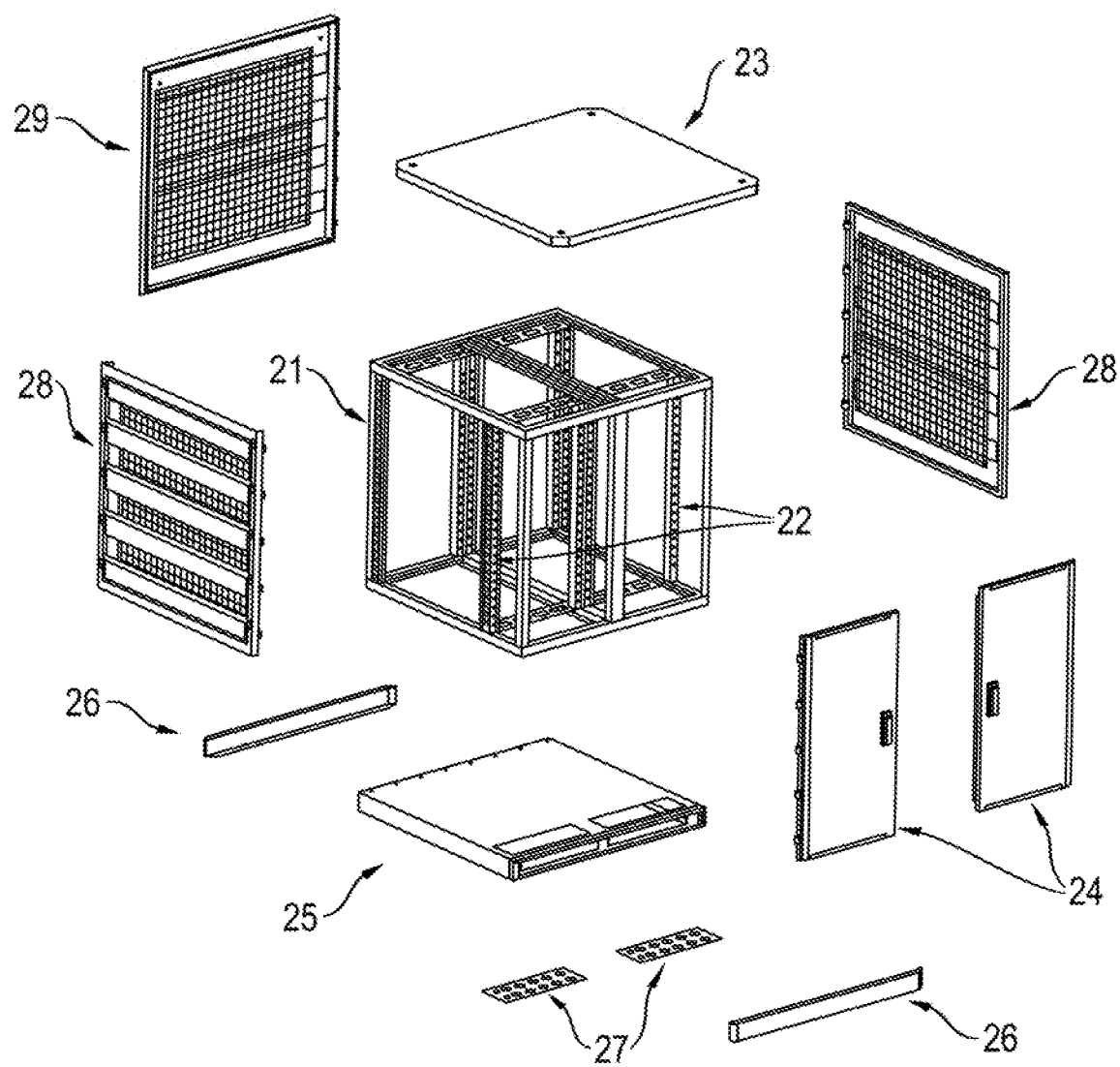
FIG. 9 shows an exploded illustration of the second housing.
Figure 10:
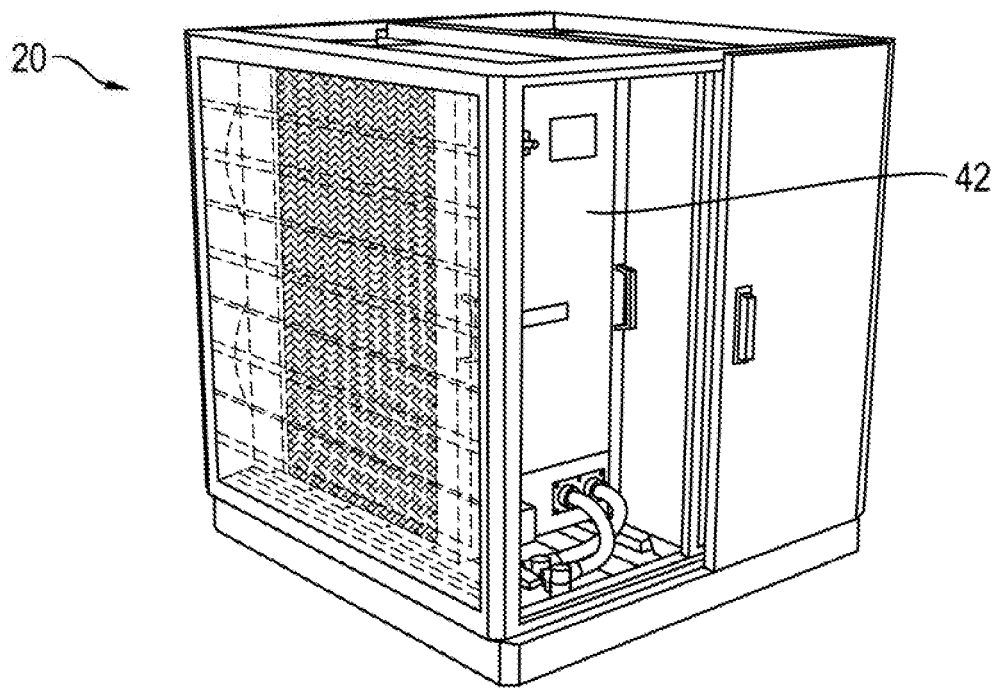
FIG. 10 shows the second housing fitted with a cooling unit.

A common feature of the illustrated embodiments is an inner base frame having a mounting rack, which, in accordance with the so-called 19-inch rack standardized in EIA 310-D, IEC 60297 and DIN 41494 SC48D, has a width of 48.26 cm for the purpose of receiving inserts and securing sensor systems and actuator systems. The base frame divides the housing into two installation spaces.

A partition for separating the installation spaces, two front doors, a cover functioning as a roof and a base plate with faceplates and cable panels are also provided accordingly. The remaining differences of the individual variants are now examined in detail with reference to exemplary configurations.

FIGS. 1 to 5 illustrate a first housing (10) configured to accommodate two power units (41) (one shown), said first housing having two side walls (18) without grates and one closed rear wall (19).

FIGS. 6 to 10 show a second housing (20) provided to accommodate two cooling units (42) (one shown), the side walls (28) and rear wall (29) of said second housing having grates for appropriate air passages.

Figure 11:
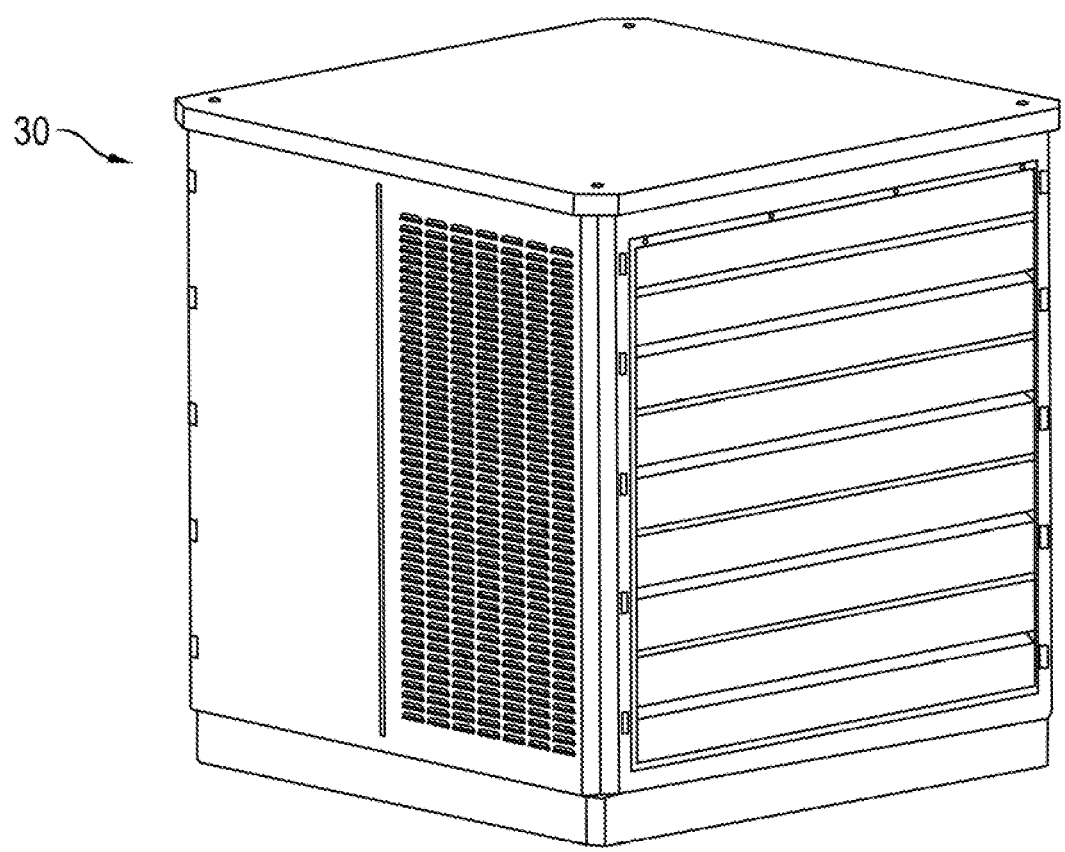
FIG. 11 shows the view of a third housing from the back left.
Figure 12:
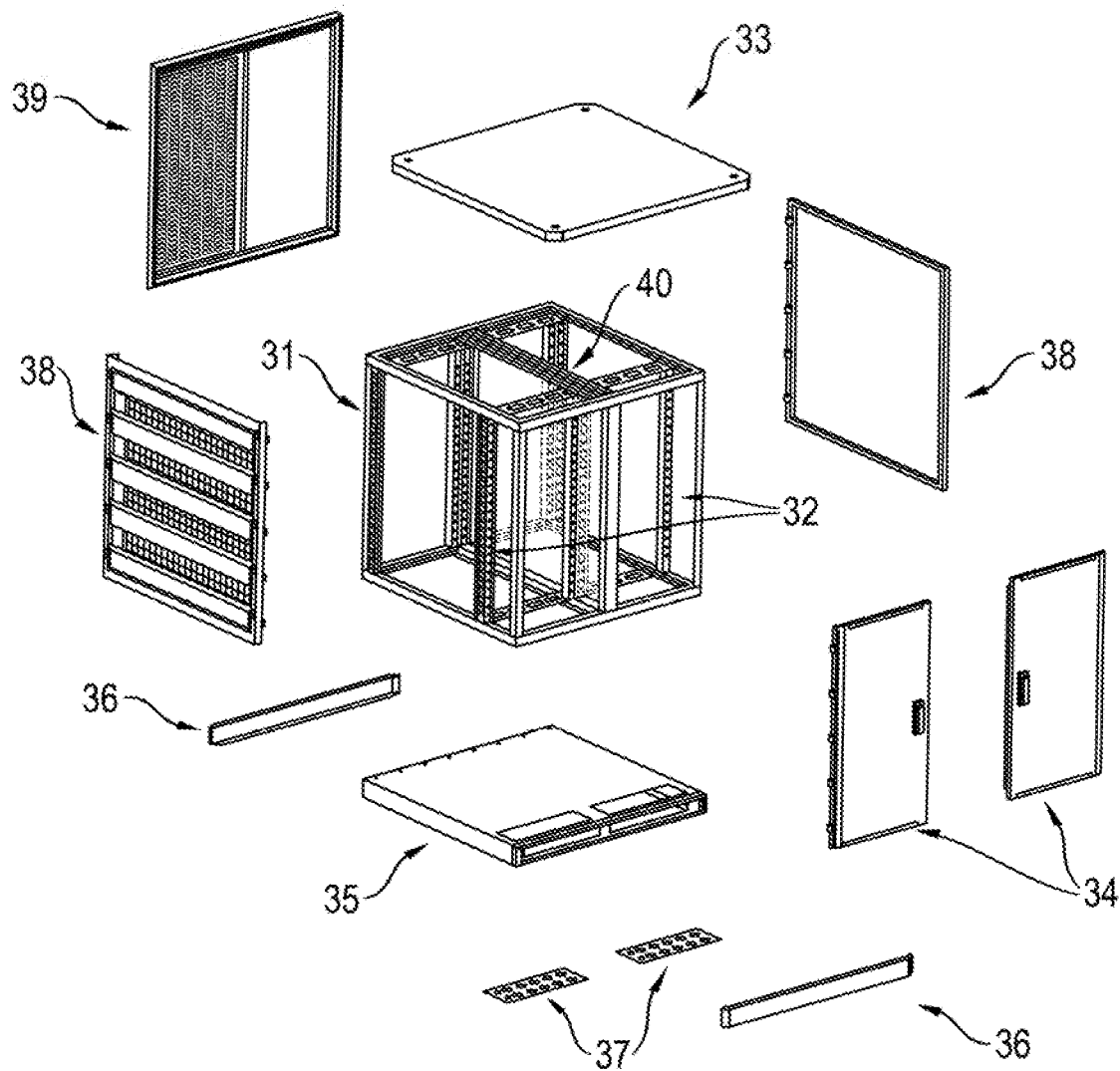
FIG. 12 shows an exploded illustration of the third housing.
Figure 13:
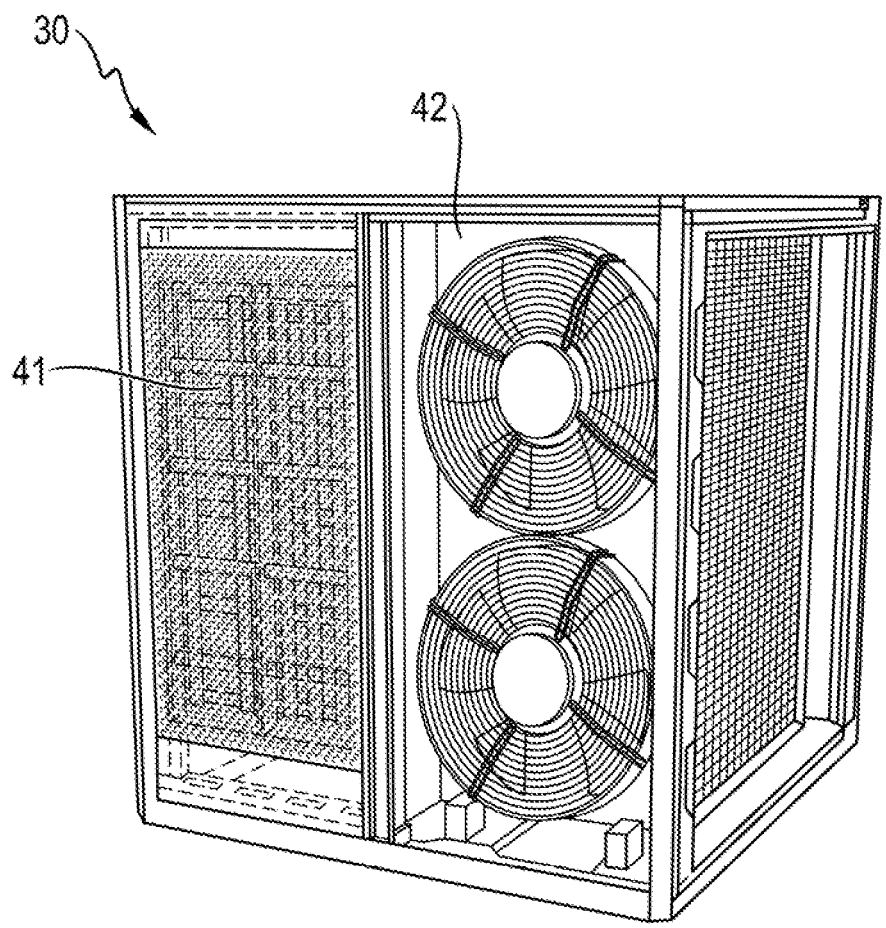
FIG. 13 shows the third housing fitted with a power unit and a cooling unit.

FIGS. 11, 12 and 13 illustrate a third housing (30) set up for simultaneously accommodating a power unit (41) and a cooling unit (42). In this case, approximately half of the rear wall (39) is grated; accordingly, the left side wall (38) in FIG. 12 is embodied as permeable to air but the right side wall (38) in accordance with the illustration is embodied as closed.

Figure 14:
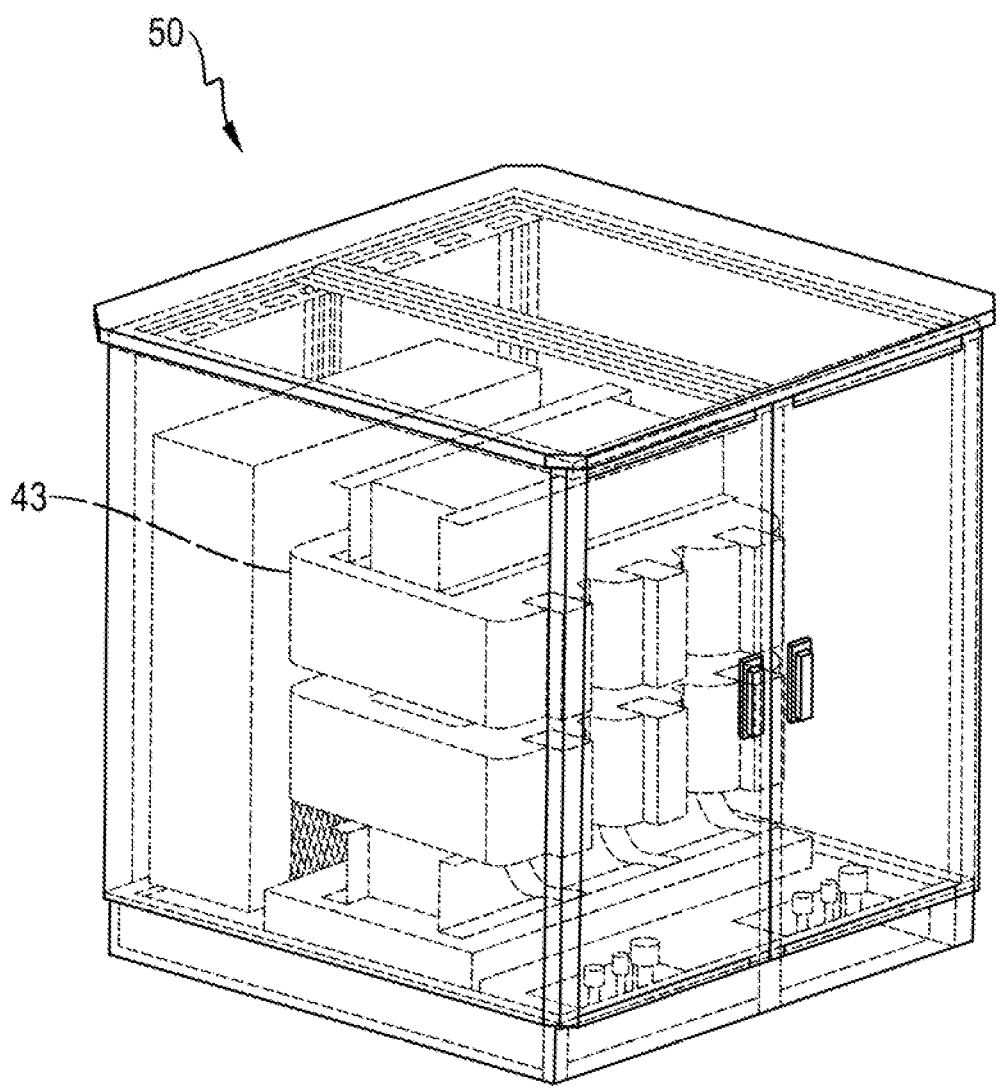
FIG. 14 shows a fourth housing fitted with a transformer.
Figure 15:
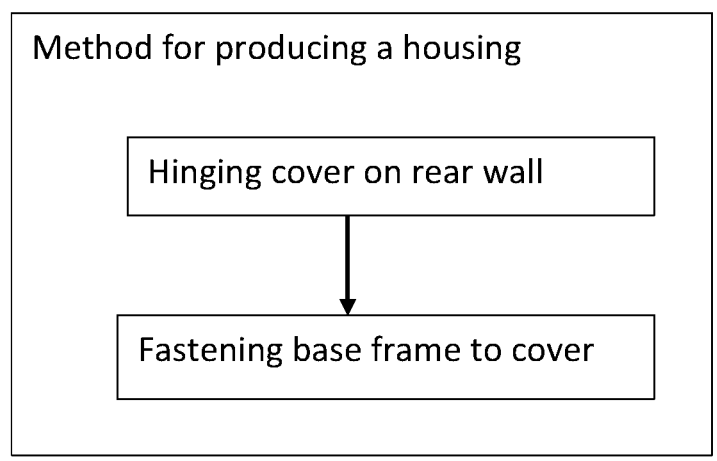
FIG. 15 depicts a flow chart of the claimed method of producing a housing.

Finally, FIG. 14 shows the alternative potential use of a housing (50) for a low-voltage isolating transformer (43) with optional air or liquid cooling system. It goes without saying that a corresponding housing (10, 20, 30, 50) may be used, for example, for an energy store without departing from the scope of the invention.

The maintenance concept provided by the doors (14, 24, 34) that are accessible from the front in this case makes it necessary to mount the cover (13, 23, 33) from the inside by hinging on the rear side and screw connection on the front side.

Aspect 1: A housing (10, 20, 30, 50) for an electricity charging station, characterized by the following features:

a base frame (11, 21, 31) having a mounting rack (12, 22, 32), a cover (13, 23, 33) connected to the base frame (11, 21, 31), two doors (14, 24, 34) hinged on the base frame (11, 21, 31), a base (15, 25, 35) connected to the base frame (11, 21, 31), two faceplates (16, 26, 36) inserted into the base (15, 25, 35) and two cable panels (17, 27, 37) embedded in the base (15, 25, 35).

Aspect 2: The housing (10, 20, 30, 50) as recited in aspect 1, characterized by the following features:

two closed side walls (18, 28, 38) and one closed rear wall (19, 29, 39).

Aspect 3: The housing (10, 20, 30, 50) as recited in aspect 1, characterized by the following features:

two air-permeable side walls (18, 28, 38) and one air-permeable rear wall (19, 29, 39).

Aspect 4: The housing (10, 20, 30, 50) as recited in aspect 1, characterized by the following features:

one closed side wall (18, 28, 38), one air-permeable side wall (18, 28, 38), one partly closed, partly air-permeable rear wall (19, 29, 39) and one partition (40).

Aspect 5: The electricity charging station, characterized by the following features:

a housing (10, 20, 30, 50) as recited in aspect 2 and a power unit (41) arranged in the housing (10, 20, 30, 50).

Aspect 6: The electricity charging station, characterized by the following features:

a housing (10, 20, 30, 50) as recited in aspect 3 and a cooling unit (42) arranged in the housing (10, 20, 30, 50).

Aspect 7: The electricity charging station, characterized by the following features:

a housing (10, 20, 30, 50) as recited in aspect 4, a power unit (41) installed in the mounting rack (12, 22, 32) and a cooling unit (42) installed in the mounting rack (12, 22, 32).

Aspect 8: The electricity charging station, characterized by the following features:

a housing (10, 20, 30, 50) as recited in one of aspects 1 to 4 and a low-voltage isolating transformer (43) with optional air or liquid cooling system installed in the mounting rack (12, 22, 32).

Aspect 9: A method for producing a housing (10, 20, 30, 50) as recited in one of aspects 1 to 4, characterized by the following features:

the cover (13, 23, 33) is hinged on the rear wall (19, 29, 39) and the base frame (11, 21, 31) is screwed to the cover (13, 23, 33) from the inside.

What is claimed is:

1. A housing for an electricity charging station, said housing comprising:

a base frame having a mounting rack, a cover connected to a top side of the base frame, two side walls, wherein a first side wall of the two side walls is fully closed and not air-permeable and a second side wall of the two side walls is air-permeable, two doors hinged on a front side of the base frame, a rear wall having a first portion that is fully closed and not air-permeable, a second portion that is air-permeable, and a central boundary separating the first portion and the second portion, a base connected to a bottom side of the base frame, a hollow interior space, a vertical partition dividing the hollow interior space into two installation spaces, and each installation space is at least partially enclosed by one of the two doors, the vertical partition corresponding in location to the central boundary of the rear wall, and the vertical partition extending in a vertical direction between the base and the cover, arranged in a horizontal direction between the side walls, and extending in a depth direction into the hollow interior space, wherein a first installation space of the two installation spaces is bounded by the first side wall and the first portion of the rear wall to either limit or prevent the flow of air through the first installation space, and a second installation space of the two installation spaces is bounded by the second side wall and the second portion of the rear wall to permit the flow of air through the second installation space, and either a power unit or a cooling unit arranged in one of the installation spaces and installed on the mounting rack.

2. The electricity charging station comprising:
the housing as claimed in claim 1, and
wherein the power unit is arranged in the first installation space of the housing.

3. The electricity charging station comprising:
the housing as claimed in claim 1, and
wherein the cooling unit is arranged in the second installation space of the housing.

4. The electricity charging station comprising:
the housing as claimed in claim 1,
wherein the power unit is installed in the mounting rack and arranged in the first installation space of the housing, and
wherein the cooling unit is installed in the mounting rack and arranged in the second installation space of the housing.

5. The electricity charging station comprising:
the housing as claimed in claim 1, and
wherein the power unit is a low-voltage isolating transformer installed in the mounting rack and arranged in the first installation space of the housing.

6. The housing as claimed in claim 1, further comprising two cable panels embedded in the base.

7. The housing as claimed in claim 1, wherein the vertical partition is oriented parallel to at least one of the sidewalls.

8. The housing as claimed in claim 1, further comprising two faceplates inserted into the front and rear sides of the base, the faceplate on the front side being positioned beneath the doors.

9. The housing as claimed in claim 8, wherein one of the faceplates is mounted beneath the doors, and the other faceplate is mounted beneath a wall of the base frame that is positioned opposite the doors.

10. The housing as claimed in claim 8, wherein each faceplate extends across an entire width of the housing.

11. A housing for an electricity charging station, said housing comprising:
a base frame having a mounting rack,
a cover connected to a top side of the base frame,
two doors hinged on a front side of the base frame, and
a base connected to a bottom side of the base frame,
wherein the housing is of modular construction and is configurable in multiple configurations,
wherein, in a first configuration of the housing, the housing further comprises (i) two closed side walls respectively connected to right and left side of the base frame, and (ii) a closed rear wall connected to a rear side of the base frame, wherein each of the closed side walls and the closed rear wall are closed and do not permit the passage of air therethrough,
wherein, in a second configuration of the housing, the housing further comprises (i) two air-permeable side walls respectively connected to the right and left side of the base frame, and (ii) an air-permeable rear wall connected to the rear side of the base frame, wherein each of the air-permeable side walls and the air-permeable rear wall permit the passage of air therethrough,
wherein, in a third configuration of the housing, the housing further comprises (i) a rear wall connected to the rear side of the base frame and having a first portion that is fully closed and not air-permeable, a second portion that is air-permeable, and a central boundary separating the first portion and the second portion, and (ii) two side walls respectively connected to the right and left side of the base frame, wherein a first side wall of the two side walls is fully closed and not air-permeable and a second side wall of the two side walls is air-permeable, wherein the first side wall is positioned on the same side of the central boundary as the first portion of the rear wall and the second side wall is positioned on the same side of the central boundary as the second portion of the rear wall.

\* \* \* \* \*